(12) United States Patent
Masuda et al.

(10) Patent No.: US 9,159,706 B2
(45) Date of Patent: Oct. 13, 2015

(54) SEMICONDUCTOR DEVICE AND A METHOD OF MANUFACTURING THE SAME

(71) Applicant: PS4 LUXCO S.A.R.L., Luxembourg (LU)

(72) Inventors: Masachika Masuda, Tokorozawa (JP); Toshihiko Usami, Akita (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/488,460

(22) Filed: Sep. 17, 2014

(65) Prior Publication Data

US 2015/0001538 A1 Jan. 1, 2015

Related U.S. Application Data

(60) Continuation of application No. 13/950,683, filed on Jul. 25, 2013, now Pat. No. 8,853,864, which is a continuation of application No. 13/413,914, filed on Mar. 7, 2012, now Pat. No. 8,502,395, which is a (Continued)

(30) Foreign Application Priority Data

Jan. 31, 2000 (JP) .................................. 2000-022802

(51) Int. Cl.
*H01L 23/58* (2006.01)
*H01L 25/065* (2006.01)
(Continued)

(52) U.S. Cl.
CPC ............. *H01L 25/0657* (2013.01); *B82Y 10/00* (2013.01); *G06K 19/077* (2013.01); *G06K 19/07732* (2013.01); *G11C 5/02* (2013.01);
(Continued)

(58) Field of Classification Search
CPC ........... H01L 2224/48227; H01L 2224/73265; H01L 2224/32225; H01L 2924/00; H01L 2924/00012; H01L 2924/00014; H01L 2224/32145; H01L 2224/45144; H01L 2224/48091; H01L 2224/49171; H01L 2924/15311; H01L 2224/49113; H01L 2225/0651; H01L 2225/06562; H01L 22/32; H01L 23/3121; H01L 23/3128; H01L 23/50; H01L 23/2388; H01L 24/06; H01L 24/45; H01L 24/48; H01L 24/49; H01L 25/0652; H01L 25/06; H01L 2924/01057; H01L 2924/01079; H01L 2924/1082; H01L 2924/014; H01L 2924/14; H01L 2924/1815; B82Y 10/00; G06K 19/077; G06K 19/07732; G11C 5/02; H05K 1/0268; H05K 1/117; H05K 2201/10159
USPC ................... 257/48, 777, 686, 723, 676, 668; 365/200; 361/737, 679.33, 744
See application file for complete search history.

(56) References Cited

U.S. PATENT DOCUMENTS 5,239,447 A * 8/1993 Cotues et al. ................. 361/744
5,422,435 A * 6/1995 Takiar et al. .................. 174/521
(Continued)

*Primary Examiner* — Mahammed Shamsuzzaman

(57) ABSTRACT

A device featuring a substrate configured to include an upper surface and an opposing lower surface and, in parallel, a first and an opposing second peripheral edge, the first peripheral edge being smaller in length than the second peripheral edge, one or more semiconductor chip mounted over the upper surface of the substrate, a control semiconductor chip mounted over the upper surface of the substrate, a sealing resin covering the memory and control chips, and a plurality of external terminals provided over the lower surface of the substrate, the external terminals being arranged in a line along the first peripheral edge. The external terminals are used to fit the device to an electronic apparatus. The device may be a memory card having a stacked arrangement of two or more memory chips, and with the control chip being apart from or included in the stacked arrangement.

3 Claims, 14 Drawing Sheets

Related U.S. Application Data continuation of application No. 13/243,583, filed on Sep. 23, 2011, now Pat. No. 8,159,062, which is a division of application No. 12/982,032, filed on Dec. 30, 2010, now Pat. No. 8,067,251, which is a division of application No. 12/574,184, filed on Oct. 6, 2009, now Pat. No. 7,879,647, which is a continuation of application No. 12/033,170, filed on Feb. 19, 2008, now Pat. No. 7,633,146, which is a division of application No. 11/392,689, filed on Mar. 30, 2006, now Pat. No. 7,348,668, which is a continuation of application No. 10/743,882, filed on Dec. 24, 2003, now Pat. No. 7,061,105, which is a division of application No. 10/194,224, filed on Jul. 15, 2002, now Pat. No. 6,686,663, which is a continuation of application No. 09/769,359, filed on Jan. 26, 2001, now Pat. No. 6,538,331.

(51) Int. Cl.

| | |
|---|---|
| *B82Y 10/00* | (2011.01) |
| *G06K 19/077* | (2006.01) |
| *G11C 5/02* | (2006.01) |
| *H01L 23/31* | (2006.01) |
| *H01L 23/50* | (2006.01) |
| *H01L 23/538* | (2006.01) |
| *H05K 1/11* | (2006.01) |
| *H01L 25/07* | (2006.01) |
| *H01L 21/66* | (2006.01) |
| *H01L 23/00* | (2006.01) |
| *H05K 1/02* | (2006.01) |
| *H05K 3/28* | (2006.01) |

(52) U.S. Cl.
CPC ............ *H01L 22/32* (2013.01); *H01L 23/3121* (2013.01); *H01L 23/3128* (2013.01); *H01L 23/50* (2013.01); *H01L 23/5388* (2013.01); *H01L 24/06* (2013.01); *H01L 24/49* (2013.01); *H01L 25/0652* (2013.01); *H01L 25/074* (2013.01); *H05K 1/117* (2013.01); *H01L 24/45* (2013.01); *H01L 24/48* (2013.01); *H01L 2224/04042* (2013.01); *H01L 2224/32145* (2013.01); *H01L 2224/32225* (2013.01); *H01L 2224/45144* (2013.01); *H01L 2224/48091* (2013.01); *H01L 2224/48227* (2013.01); *H01L 2224/49113* (2013.01); *H01L 2224/49171* (2013.01); *H01L 2224/73265* (2013.01); *H01L 2225/0651* (2013.01); *H01L 2225/06562* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01033* (2013.01); *H01L 2924/01039* (2013.01); *H01L 2924/01057* (2013.01); *H01L 2924/01079* (2013.01); *H01L 2924/01082* (2013.01); *H01L 2924/14* (2013.01); *H01L 2924/15311* (2013.01); *H01L 2924/1815* (2013.01); *H01L 2924/351* (2013.01); *H05K 1/0268* (2013.01); *H05K 3/284* (2013.01); *H05K 2201/10159* (2013.01); *H05K 2203/1572* (2013.01)

(56) References Cited

U.S. PATENT DOCUMENTS

| | | | | |
|---|---|---|---|---|
| 5,481,432 | A * | 1/1996 | Tsukada et al. | 361/679.33 |
| 5,780,925 | A * | 7/1998 | Cipolla et al. | 257/676 |
| 5,998,864 | A * | 12/1999 | Khandros et al. | 257/723 |
| 6,060,770 | A * | 5/2000 | Nakamura et al. | 257/668 |
| 6,381,143 | B1 * | 4/2002 | Nakamura | 361/737 |
| 6,410,987 | B1 * | 6/2002 | Kanemoto et al. | 257/777 |
| 6,538,331 | B2 * | 3/2003 | Masuda et al. | 257/777 |
| 6,621,155 | B1 * | 9/2003 | Perino et al. | 257/686 |
| 2004/0090829 | A1 * | 5/2004 | Miura et al. | 365/200 |

* cited by examiner

SEMICONDUCTOR DEVICE AND A METHOD OF MANUFACTURING THE SAME

This application is a Continuation of U.S. application Ser. No. 13/950,683, filed Jul. 25, 2013, which is a Continuation of U.S. application Ser. No. 13/413,914, filed Mar. 7, 2012, now U.S. Pat. No. 8,502,395, which, in turn, is Continuation of U.S. application Ser. No. 13/243,583, filed Sep. 23, 2011, now U.S. Pat. No. 8,159,062, which, in turn, is a Division of U.S. application Ser. No. 12/982,032, filed Dec. 30, 2010, now U.S. Pat. No. 8,067,251, which, in turn, is a Division of U.S. application Ser. No. 12/574,184, filed Oct. 6, 2009, now U.S. Pat. No. 7,879,647, which, in turn, is a Continuation of U.S. application Ser. No. 12/033,170, filed Feb. 19, 2008, now U.S. Pat. No. 7,633,146, which, in turn, is a Division of U.S. application Ser. No. 11/392,689, filed Mar. 30, 2006, now U.S. Pat. No. 7,348,668, which, in turn, is a Continuation of U.S. application Ser. No. 10/743,882, filed Dec. 24, 2003, now U.S. Pat. No. 7,061,105, which, in turn, is a Division of U.S. application Ser. No. 10/194,224, filed Jul. 15, 2002, now U.S. Pat. No. 6,686,663, and which, in turn, is a Continuation of U.S. application Ser. No. 09/769,359, filed Jan. 26, 2001, now U.S. Pat. No. 6,538,331; the entire disclosures of all of which are hereby incorporated by reference.

FIELD OF THE INVENTION

The present invention relates to a semiconductor device, and to a technique for manufacturing the same; and, more particularly, the invention relates to a technique which is effective when applied to a semiconductor device having a plurality of semiconductor chips stacked therein, and which is resin-sealed in a single package.

BACKGROUND OF THE INVENTION

As one of the measures for increasing the capacity of a memory LSI, such as a flash memory or a DRAM (dynamic random access memory), a variety of memory module structures, which are manufactured by stacking semiconductor chips, each having such a memory LSI formed thereon, and then sealing them in a single package, have been proposed.

For example, Japanese Patent Application Laid-Open No. Hei 4(1992)-302164 discloses a package structure obtained by stacking, stepwise, in one package, a plurality of semiconductor chips having the same function and the same size via an insulating layer, and electrically connecting a bonding pad which is exposed at the stepped portion of each of the semiconductor chips with an inner lead of the package through a wire.

Japanese Patent Application Laid-Open No. Hei 11(1999)-204720 discloses a package structure manufactured by loading a first semiconductor chip on an insulating substrate via a thermocompressive sheet, loading on the first semiconductor chip a second semiconductor chip which is smaller in external size than the first semiconductor chip via another thermocompressive sheet, electrically connecting each of the bonding pads of the first and second semiconductor chips with an interconnect layer on the insulating substrate via a wire, and then resin-sealing the first and second semiconductor chips and the wire.

SUMMARY OF THE INVENTION

If at least two semiconductor chips, which are similar in size and in the position of a bonding pad thereof, are mounted, and the bonding pad of each of the semiconductor chips is connected with an electrode of the substrate by a wire, it becomes difficult to detect the existence of a short circuit between the wires in a visual inspection step conducted after completion of the wire bonding step, because a plurality of wires for connecting each of the electrically common bonding pads of these semiconductor chips with an electrode seem to overlap when viewed downwards from above.

Among the plurality of wires for connecting the electrically common bonding pad with an electrode, the wire to be connected with the bonding pad of the lower semiconductor chip lies almost directly under the wire to be connected with the bonding pad of the upper semiconductor chip. Lowering the loop height of the wire to be connected with the bonding pad of the upper semiconductor chip therefore reduces the distance between the wire and a wire directly thereunder, which tends to cause a short circuit between these wires. An increase in the loop height of the wire to be connected with the bonding pad of the upper semiconductor chip to prevent such a phenomenon, on the other hand, thickens the resin provided for sealing the semiconductor chip and wire, thereby making it difficult to reduce the thickness of the package.

An object of the present invention is to provide a technique for improving the reliability of the visual inspection conducted after a wire bonding step, in a semiconductor device having a plurality of semiconductor chips stacked on one another and sealed with a resin.

Another object of the present invention is to provide a technique for promoting a size and thickness reduction of a semiconductor device having a plurality of semiconductor chips stacked on one another and sealed with a resin.

A further object of the present invention is to provide a technique for reducing the manufacturing cost of a semiconductor device having a plurality of semiconductor chips stacked on one another and sealed with a resin.

The above-described and other objects and novel features of the present invention will be apparent from the description herein and the accompanying drawings.

Among the features of the invention disclosed by the present application, summaries of the typical aspects will next be described briefly.

A semiconductor device according to the present invention is obtained by mounting, over a substrate, a first semiconductor chip having a plurality of bonding pads formed along one of the sides of the main surface thereof; stacking, over the main surface of the first semiconductor chip, a second semiconductor chip having a plurality of bonding pads formed along one of the sides of the main surface thereof; electrically connecting each of the bonding pads of the first semiconductor chip and each of the bonding pads of the second semiconductor chip with an electrode on the substrate via a wire; and sealing the first and second semiconductor chips and the wires with a resin, wherein the second semiconductor chip is stacked over the main surface of the first semiconductor chip while being slid (i.e., offset) in a direction parallel to said one side of the semiconductor chip and in a direction perpendicular thereto.

Another semiconductor device according to the present invention is obtained by mounting, over a substrate, a first semiconductor chip having a plurality of bonding pads formed along one of the sides of the main surface thereof; stacking, over the main surface of the first semiconductor chip, a second semiconductor chip having a plurality of bonding pads formed along one of the sides of the main surface, while sliding (i.e., offsetting) the second semiconductor chip in a direction parallel to said one side of the first semiconductor chip and in a direction perpendicular thereto in such a way that the one side of the second semiconductor chip becomes opposite to the one side of the first semiconductor chip and the bonding pad of the first semiconductor chip is exposed; stacking a third semiconductor chip having a plurality of bonding pads formed along the one side of the main surface over the main surface of the second semiconductor chip in such a way that the one side of the third semiconductor chip extends along the same direction with the one side of the first semiconductor chip, and, at the same time, the third semiconductor chip is stacked to have the same direction with that of the first semiconductor chip; electrically connecting the bonding pads of the first, second and third semiconductor chips with electrodes on the substrate via wires; and sealing the first, second and third semiconductor chips and the wires with a resin.

The manufacturing process of the semiconductor device according to the present invention has the following steps:

(a) mounting, over a substrate, a first semiconductor chip having a plurality of bonding pads formed along one of the sides of the main surface;

(b) stacking, over the main surface of the first semiconductor chip, a second semiconductor chip having a plurality of bonding pads formed along one of the sides of the main surface, while sliding it in a direction parallel to said one side of the first semiconductor chip and in a direction perpendicular thereto;

(c) electrically connecting, via wires, the plurality of bonding pads formed on the first and second semiconductor chips with electrodes formed on the substrate; and (d) sealing the first and second semiconductor chips and the wires with a resin.

DETAILED DESCRIPTION OF THE PREFERRED EMBODIMENTS

Figure 1:
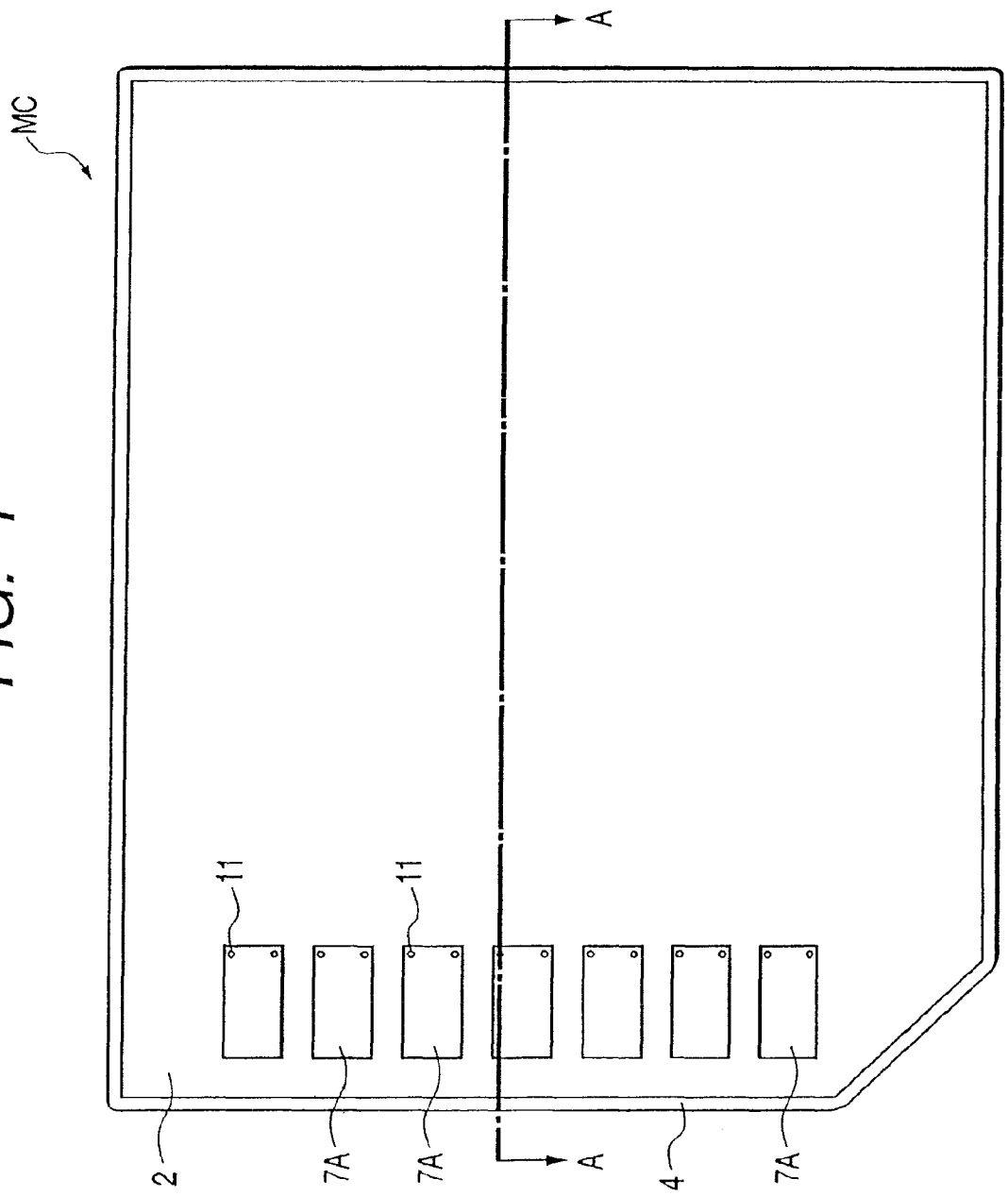
FIG. 1 is a plan view illustrating the outer appearance of the semiconductor device according to one embodiment of the present invention.

Embodiments of the present invention will hereinafter be described in detail based on the accompanying drawings. In all the drawings which illustrate the embodiments of the present invention, members having a like function will be identified by like reference numerals and overlapping descriptions thereof will be omitted.

Embodiment 1

Figure 2:
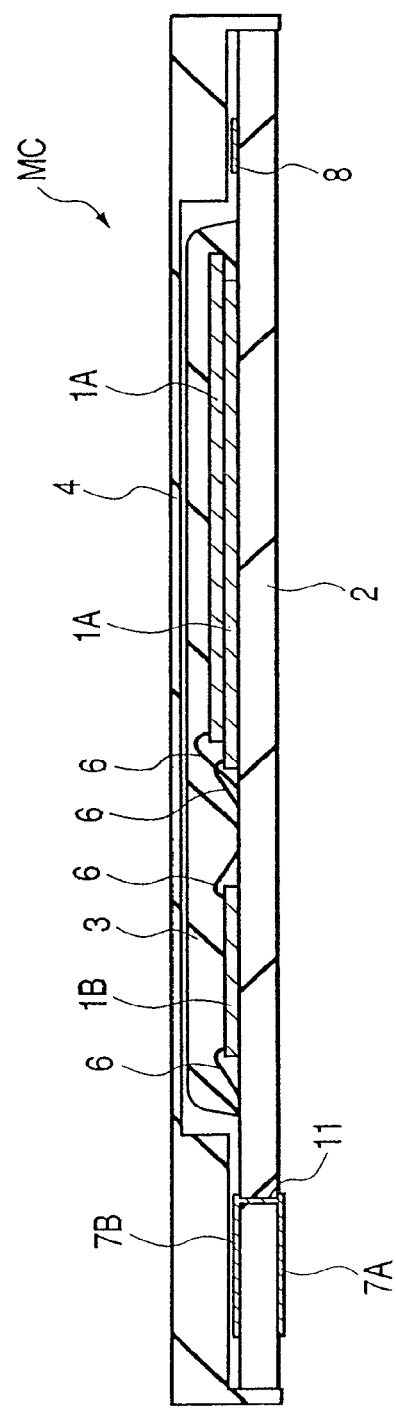
FIG. 2 is a cross-sectional view taken along a line A-A of FIG. 1.
Figure 3:
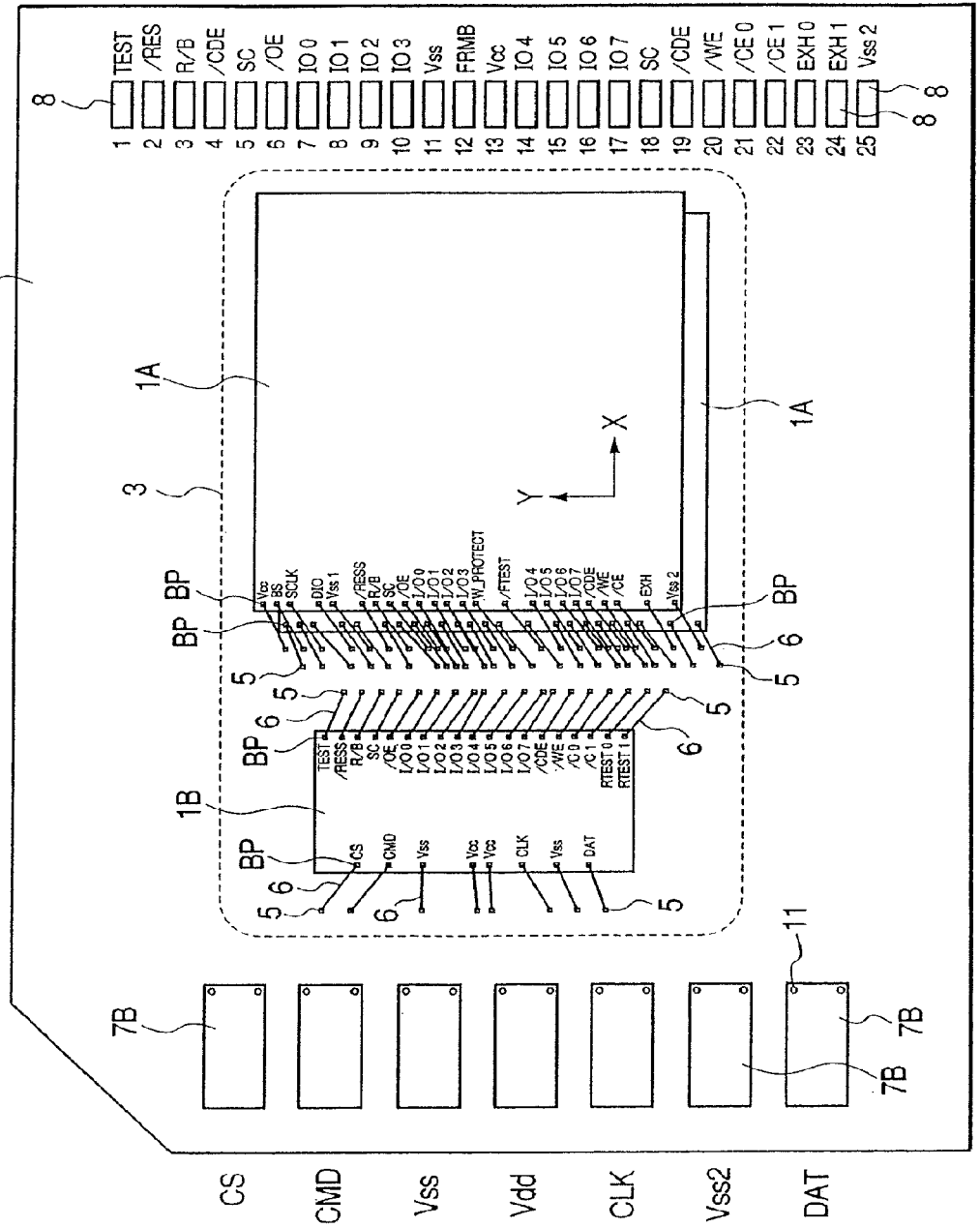
FIG. 3 is a plan view illustrating the base substrate of the semiconductor device of FIG. 1.

FIG. 1 is a plan view illustrating the outer appearance of the semiconductor device according to this Embodiment; FIG. 2 is a cross-sectional view taken along the longitudinal direction (a line A-A) of this semiconductor device; and FIG. 3 is a plan view illustrating the base substrate of this semiconductor device.

The semiconductor device according to this Embodiment is a memory card MC which is obtained by mounting, over a base substrate 2, two semiconductor chips (which will hereinafter be called chips or memory chips) 1A having, over the main surface thereof, a flash memory formed as a semiconductor element and a semiconductor chip (which will hereinafter be called a chip or control chip) 1B having a control circuit for the flash memory formed thereon; sealing these three chips 1A, 1A and 1B with a resin 3; and then, covering the upper surface of the base substrate 2 with a resin-made cap 4. This memory card MC is used for storing data, such as image data, for example, as a built-in memory of a portable electronic apparatus, such as a digital camera. The external size of the memory card MC is, for example, 32 mm on its longer side, 24 mm on its shorter side and 1.2 mm in thickness.

The two memory chips 1A mounted over the base substrate 2 of the memory card MC have the same external size and have flash memories of the same memory capacity formed thereon. These memory chips 1A are mounted over the base substrate 2, with one chip being stacked over the upper portion of another. The lower memory chip 1A is bonded to the upper surface of the base substrate 2 with an adhesive or the like, while the upper memory chip 1A is bonded to the upper surface of the lower memory chip 1A with an adhesive or the like. The control chip 1B is, on the other hand, mounted over the base substrate 2 in the vicinity of the memory chips 1A and is bonded to the upper surface of the base substrate 2 with an adhesive or the like. These three chips 1A, 1A, 1B are each mounted over the base substrate 2 with the main surface (element formed surface) of each of them facing up.

On the main surface of each of the two memory chips 1A having a flash memory formed thereon, a plurality of bonding pads BP are formed in a line along one side of each of the memory chips. In other words, the memory chip 1A adopts a one-side pad system, wherein bonding pads are formed at the periphery of the element surface, and, at the same time, are disposed in a line along one side of the memory chip. On the main surface of the control chip 1B, on the other hand, a plurality of bonding pads BP are formed in a line along each of the two longer sides of the chip opposite each other.

The two memory chips 1A are stacked one on another, while keeping their directions the same. The bonding pads BP of one memory chip 1A are disposed in proximity to the bonding pads BP of the other memory chip 1A. The upper memory chip 1A is stacked over the lower memory chip IA, while sliding them in a direction (X direction) parallel to one side of the lower memory chip 1A and in a direction (Y direction) perpendicular thereto, whereby a partial overlapping of the upper memory chip 1A with the AI bonding pad BP of the lower memory chip 1A can be avoided.

On the base substrate 2 in the vicinity of the chips 1A, IA, IB, a plurality of electrodes 5 are formed, and the bonding pads of each of the chips 1A, IA, IB are electrically connected with the corresponding electrodes 5 via a wire 6 made of Au (gold). The bonding pads BP of each of the chips 1A, IA, IB are electrically connected with the connecting terminals 7B formed on one end of the main surface of the base substrate 2 and test pads 8 formed on the other end via the electrodes 5 and a wiring (not illustrated) of the base substrate 2 electrically connected with the electrodes 5. The connecting terminal 7B is used as a connecting terminal for fitting this memory card MC to a portable electronic apparatus and is electrically connected with an external connecting terminal 7A on the bottom surface of the base substrate 2 via a through-hole 11. The test pad 8 is used for the measurement of electrical properties, such as, for example, in a fabrication step of this memory card MC.

Figure 4A:
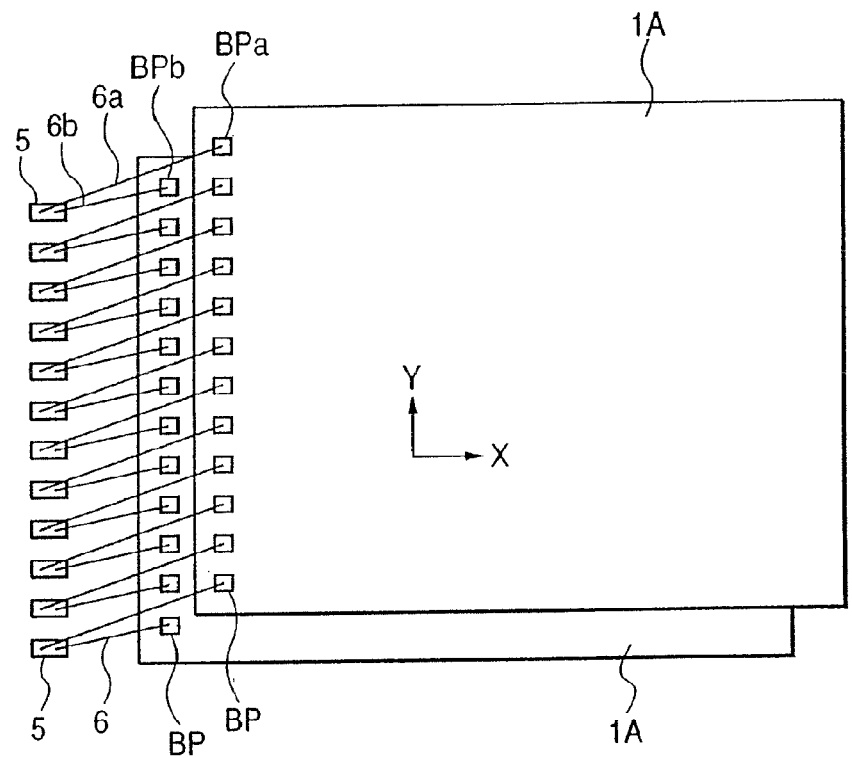
FIG. 4(a) is a schematic plan view illustrating the connection of the bonding pads of two memory chips with the corresponding electrodes of the base substrate via wires by the chip stacking system according to the present invention.
Figure 4B:
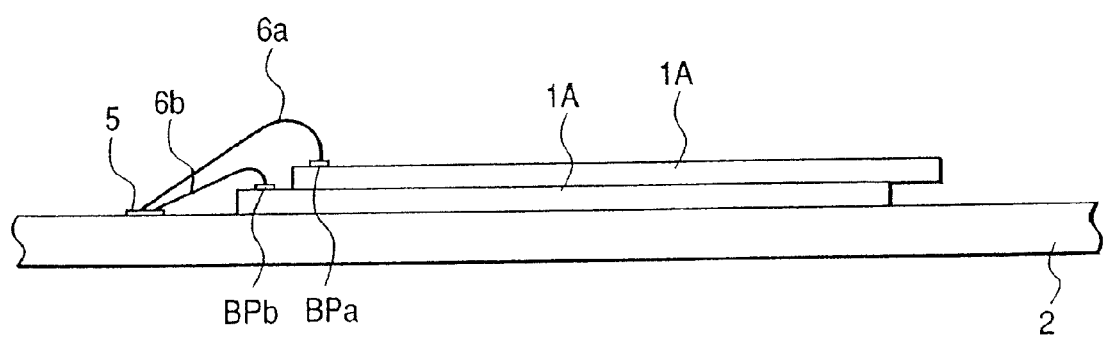
FIG. 4(b) is a schematic cross-sectional view illustrating the connection of the bonding pads of two memory chips with the corresponding electrodes of the base substrate via wires by the chip stacking system according to the present invention.

FIG. 4(a) is a schematic plan view illustrating the state of connection of the bonding pads BP of each of the two memory chips 1A with the corresponding electrodes 5 of the base substrate 2 via wires 6; and FIG. 4(b) is a cross-sectional view thereof.

As described above, the memory chips 1A are stacked in two layers and the upper memory chip 1A is stacked over the lower memory chip 1A, while sliding the upper memory chip 1A, in the X direction parallel to one side of the lower memory chip 1A and in the Y direction perpendicular thereto. When the electrically common bonding pads BP (for example, the bonding pad BPa of the upper memory chip 1A and the bonding pad BPb of the lower memory chip 1A) of the two memory chips 1A and the corresponding electrode 5 are connected through two wires 6 (for example, the wire 6a and wire 6b), the wire 6a connected with one of the bonding pads BPa does not overlap with the wire 6B connected with the other bonding pad BPb when viewed from above. In this case, it is therefore possible to easily examine the state of connection of the wires 6 and detect, for example, the existence of a short circuit between the upper and lower wires 6 by viewing downwards, through a camera, the base substrate 2 in a visual inspection step conducted after completion of the wire bonding step.

When the upper memory chip 1A is stacked over the lower memory chip 1A while sliding the upper memory chip 1A only in one direction (for example, X direction), the wire 6a connected with the bonding pad of one of the memory chips 1A seems to overlap with the wire 6b connected with the other memory chip 1A when viewed from above, which makes it difficult to visually detect the existence of a short circuit between the upper and lower wires 6.

Figure 5A:
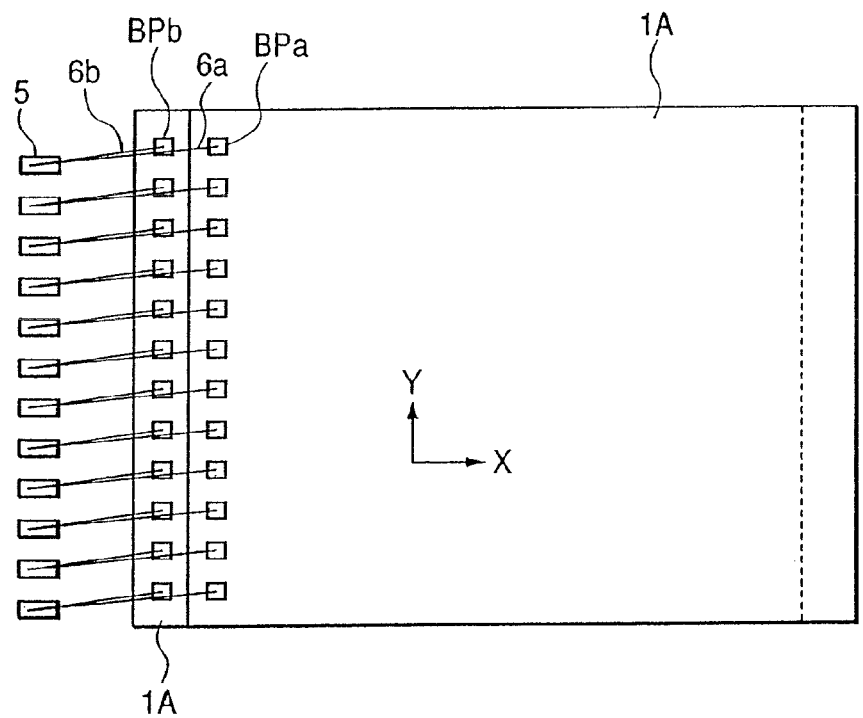
FIG. 5(a) is a schematic plan view illustrating the connection of the bonding pads of two memory chips with the corresponding electrodes of the base substrate via wires by another system.
Figure 5B:
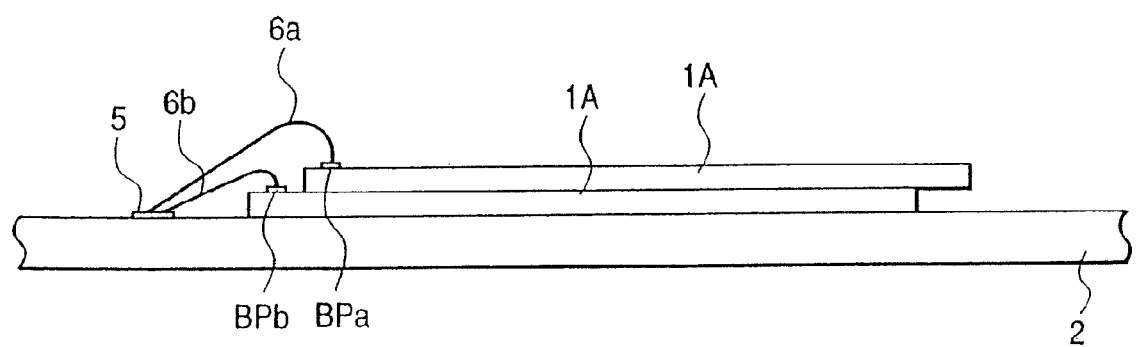
FIG. 5(b) is a schematic cross-sectional view illustrating the connection of the bonding pads of two memory chips with the corresponding electrodes of the base substrate via wires by the system of FIG. 5(a)

In the above-described stacking system, as illustrated in FIGS. 5(a) and 5(b), the wire 6b connected with the bonding pad BPb of the lower memory chip 1A lies almost right under the wire 6a connected with the bonding pad BPa of the upper memory chip 1A, so that lowering the loop height of the wire 6a reduces the distance with the wire 6b lying directly thereunder, tending to cause short circuit therebetween.

Since, in the chip stacking system of FIG. 4(a) according to this Embodiment, the wire 6a and the wire 6b connected with the same electrode 5 are slid in a horizontal direction, lowering the loop height of the wire 6a is not likely to cause a short circuit with the wire 6b, which lies under the wire 6a. In other words, adoption of the chip stacking system according to this Embodiment makes it possible to lower the loop height of the wire 6 connected with the bonding pad BP of the upper memory chip 1A, thereby decreasing the thickness of the resin for sealing the chips 1A, IA, IB and the wire 6, leading to a thickness and weight reduction of the resulting memory card MC.

The memory card MC of this Embodiment, having the structure as described above, can be fabricated as follows. First, a first memory chip 1A is mounted over a base substrate 2 using an adhesive or the like, followed by stacking a second memory chip 1A over the upper surface of the first memory chip 1A using an adhesive or the like, while sliding the second memory chip 1A in each of X and Y directions relative to the first memory chip 1A. Almost simultaneously with the stacking work, a control chip 1B is mounted using an adhesive or the like over the other region of the base substrate 2.

Next, the base substrate 2, having the chips 1A, IA, IB mounted thereover, is loaded on a heating stage of a wire bonding apparatus. After the reverse side of the base substrate 2 is fixed at the heating stage by vacuum adsorption or the like, the bonding pads BP of the chips 1A, IA, IB and corresponding electrodes 5 are electrically connected successively with a wire 6. For the connection via the wire 6, a wire bonding method using thermo compression bonding and supersonic vibration in combination is employed. Upon connection of the bonding pad BP of the upper memory chip 1A with the electrode 5 via the wire 6, the loop height of the wire 6 to be connected with the bonding pad BP of the upper memory chip 1A can be lowered more by adopting a reverse bonding system, wherein bonding (first bonding) of one end of the wire 6 to the surface of the electrode 5 is followed by bonding (second bonding) of the other end of the wire 6 to the surface of the bonding pad BP.

After determination of the connected state of the wire 6 by visual inspection, the chips 1A, IA, IB and wire 6 are sealed with a resin 3. Sealing may be conducted with either one of a potting resin or a molding resin. Electrical properties are then tested by bringing a probe into contact with the test pad 8 formed on one end of the base substrate 2. The upper surface of the base substrate 2 is covered with a resin-made cap 4, whereby the memory card MC according to this Embodiment as illustrated in FIGS. 1 to 3 is completed.

Figure 6:
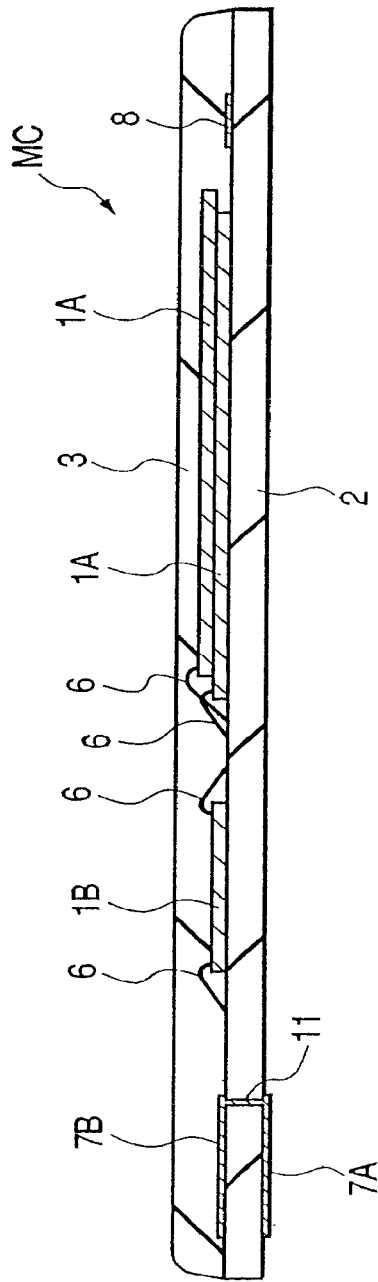
FIG. 6 is a cross-sectional view illustrating the semiconductor device according to another embodiment of the present invention.

In order to reduce the manufacturing cost by decreasing the number of parts which make up the memory card, the whole upper surface of the base substrate 2 may be sealed with the resin 3, as illustrated in FIG. 6, instead of covering the upper surface of the base substrate 2 with the cap 4. Upon resin sealing, either single substrate sealing or multiple substrate sealing may be adopted.

Figure 7:
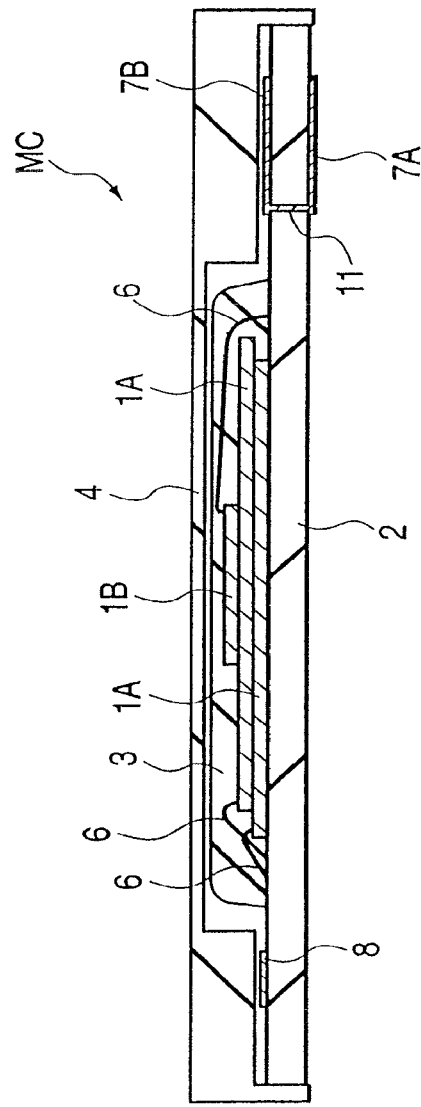
FIG. 7 is a cross-sectional view illustrating the semiconductor device according to another embodiment of the present invention.
Figure 8:
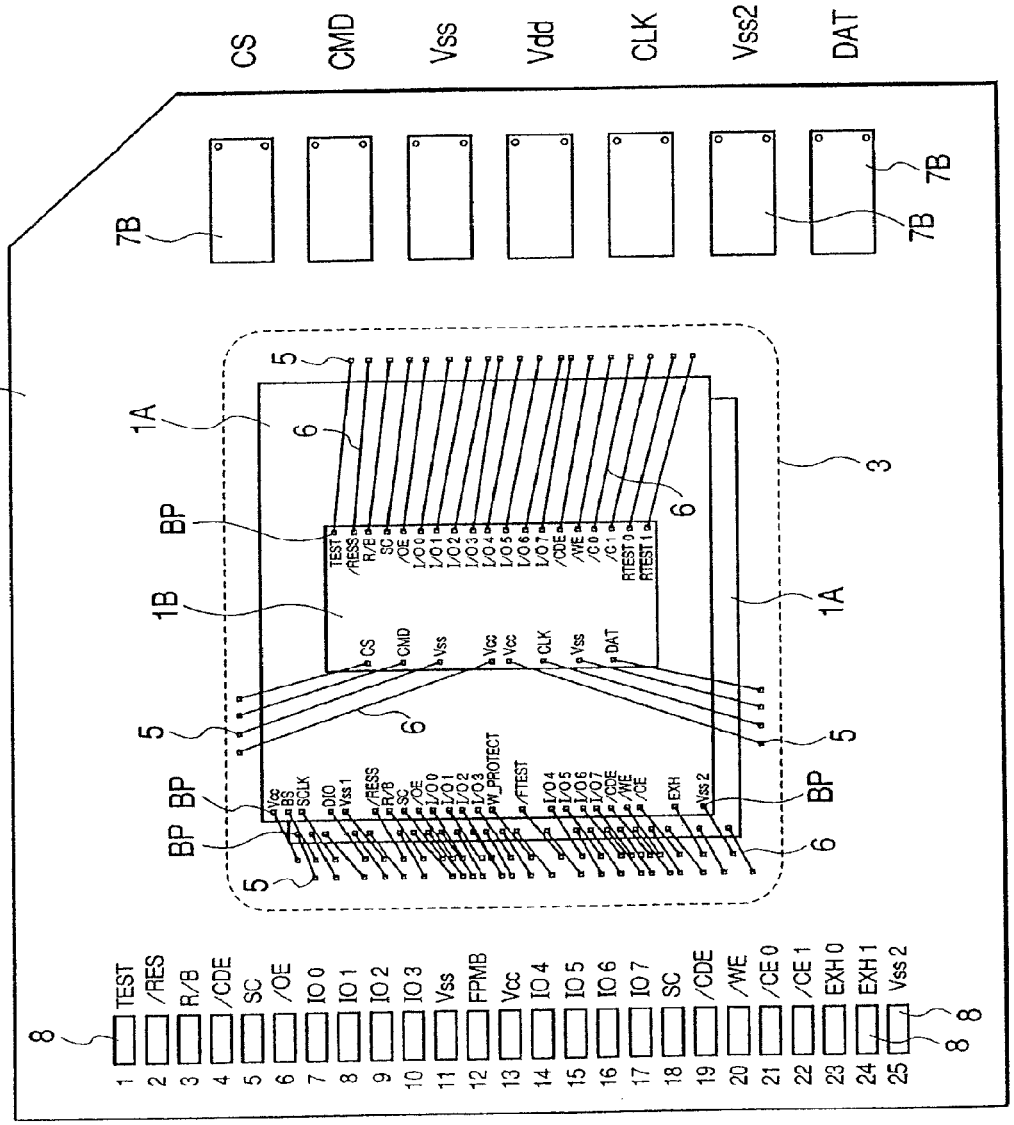
FIG. 8 is a plan view illustrating the base substrate of the semiconductor device of FIG. 7.

The above-described memory card MC has the control chip 1B mounted over the base substrate 2, but it is possible to stack the control chip 1B, which is smaller in external size than the memory chip 1A, over the upper surface of the upper memory chip 1A, as illustrated in FIGS. 7 and 8.

Adoption of such a chip stacking system makes it possible to decrease the external size of the base substrate 2, because a separate region of the base substrate 2 to mount the control chip 1B thereon becomes unnecessary, leading to a reduction in the size and weight of the memory card MC.

In such a chip stacking system, however, the chips 1A, IA, IB are stacked in three layers, which increases the thickness of the resin for sealing the chips 1A, IA, IB and wire 6, thereby preventing a reduction of the thickness of the memory card MC. As a countermeasure, an increase in the thickness of the resin 3 can be suppressed by polishing the reverse side of each of the chips 1A, IA, IB, thereby decreasing their thicknesses.

Figure 9:
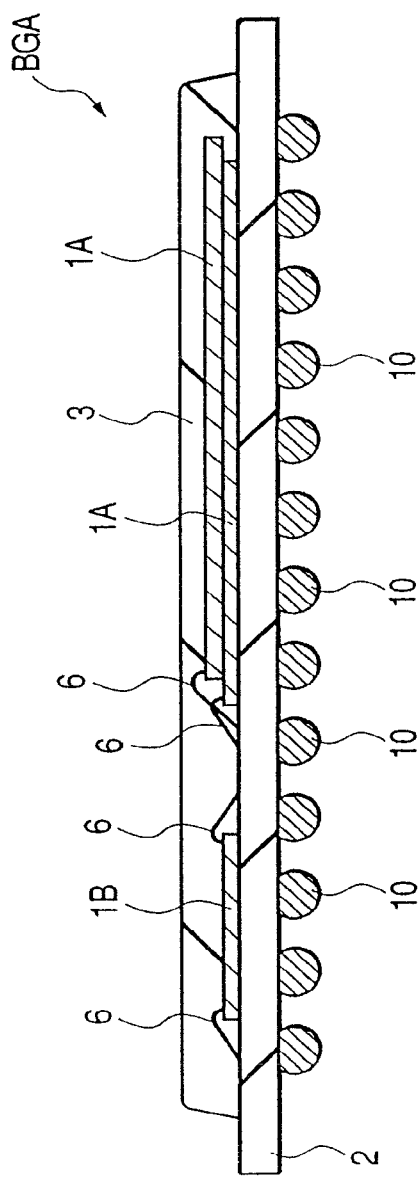
FIG. 9 is a cross-sectional view illustrating the semiconductor device according to a further embodiment of the present invention.
Figure 10:
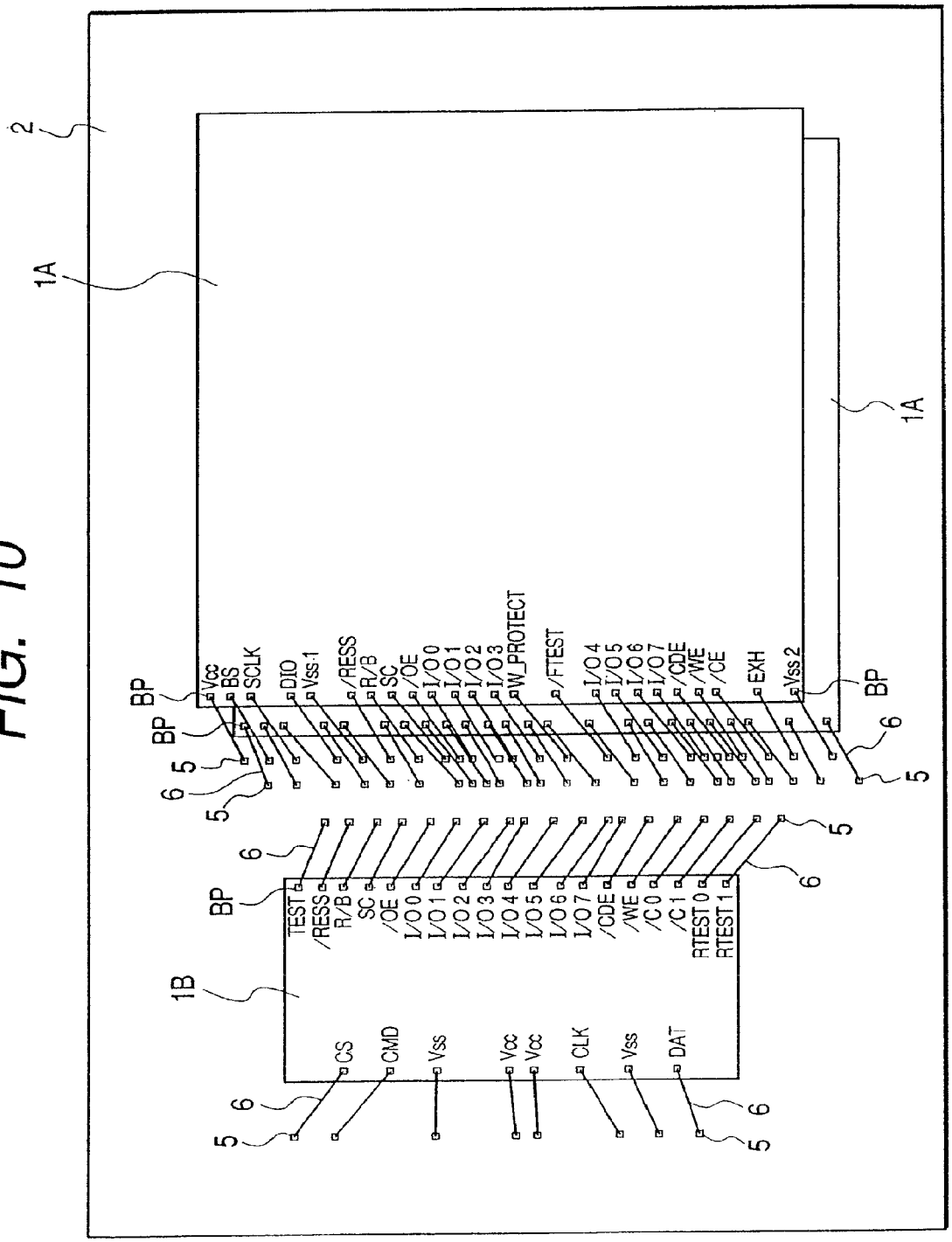
FIG. 10 is a plan view illustrating the base substrate of the semiconductor device of FIG. 9.
Figure 11:
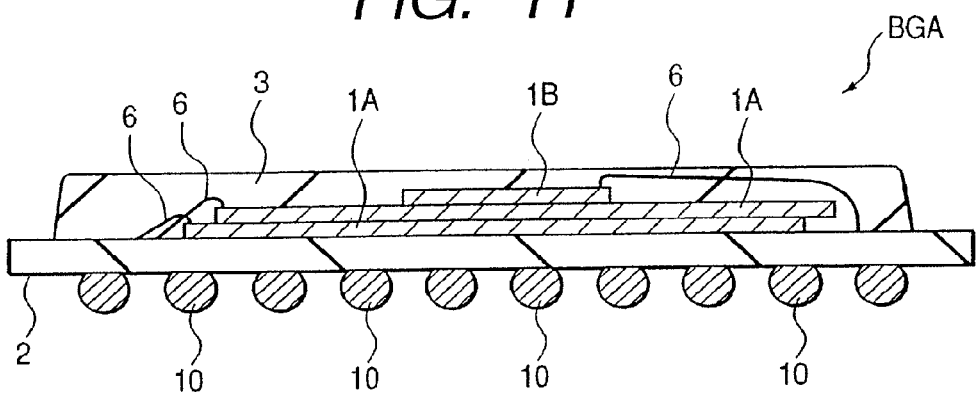
FIG. 11 is a cross-sectional view illustrating the semiconductor device according to a still further embodiment of the present invention.
Figure 12:
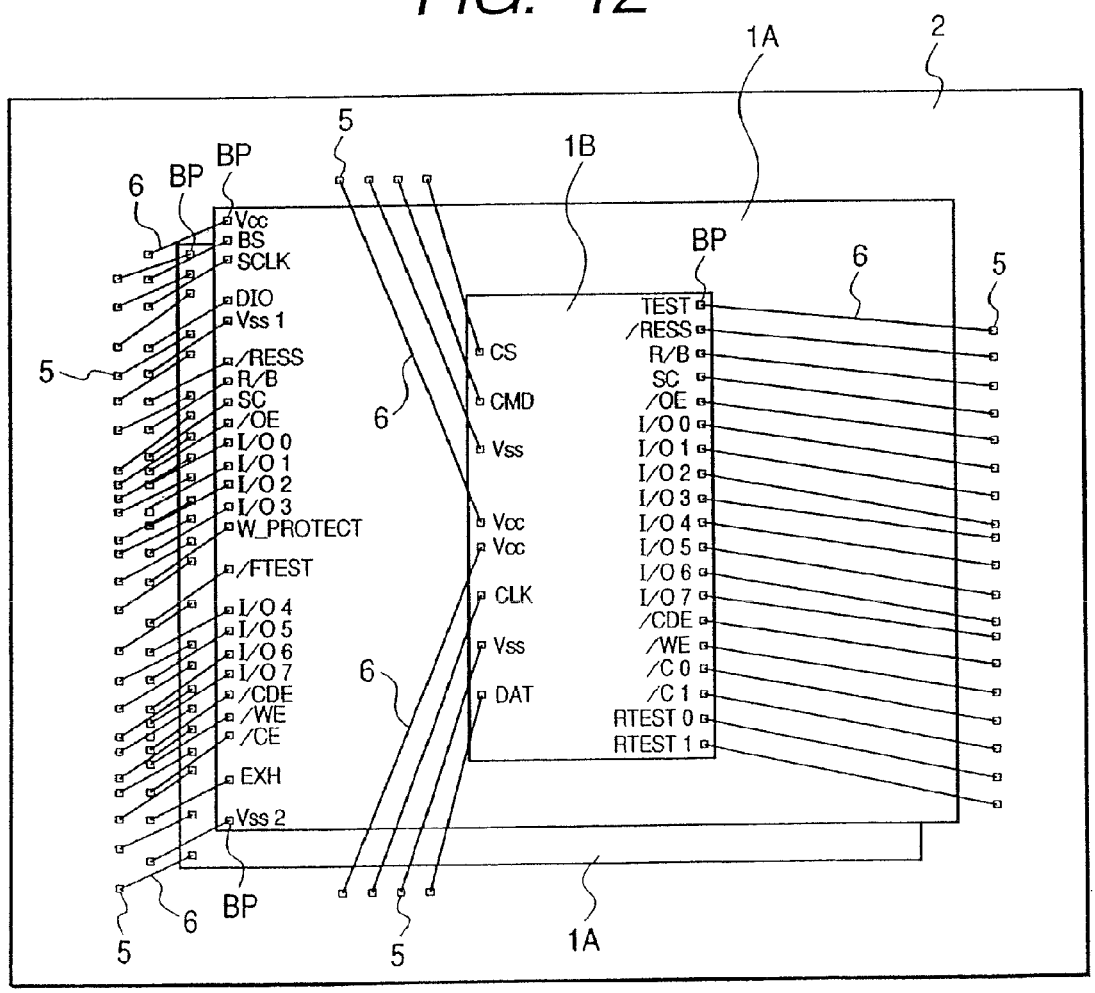
FIG. 12 is a plan view illustrating the base substrate of the semiconductor device of FIG. 11.

The chip stacking system according to this Embodiment can also be applied to a package like a BGA (ball grid array) type package. The BGA as illustrated in FIGS. 9 and 10 is obtained, for example, by using a resin 3 to seal the whole upper surface of a base substrate 2 having thereon two memory chips 1A, stacked in respective layers, and a control chip 1B, and by connecting, via the bottom surface of the base substrate 2, a bump electrode 10 made of solder or the like. The BGA as illustrated in FIGS. 11 and 12 is obtained by stacking the control chip 1B over the two memory chips 1A, which are stacked in respective layers.

When the chip stacking system of this Embodiment is applied to a BGA, the thermal stress applied to the bump electrode 10 upon mounting of the BGA to the substrate can be reduced by interposing, between the lower memory chip 1A and base substrate 2, a sheet material made of an elastomer or, porous resin which has a lower modulus of elasticity than the resin material forming the base substrate 2.

Embodiment 2

Figure 13:
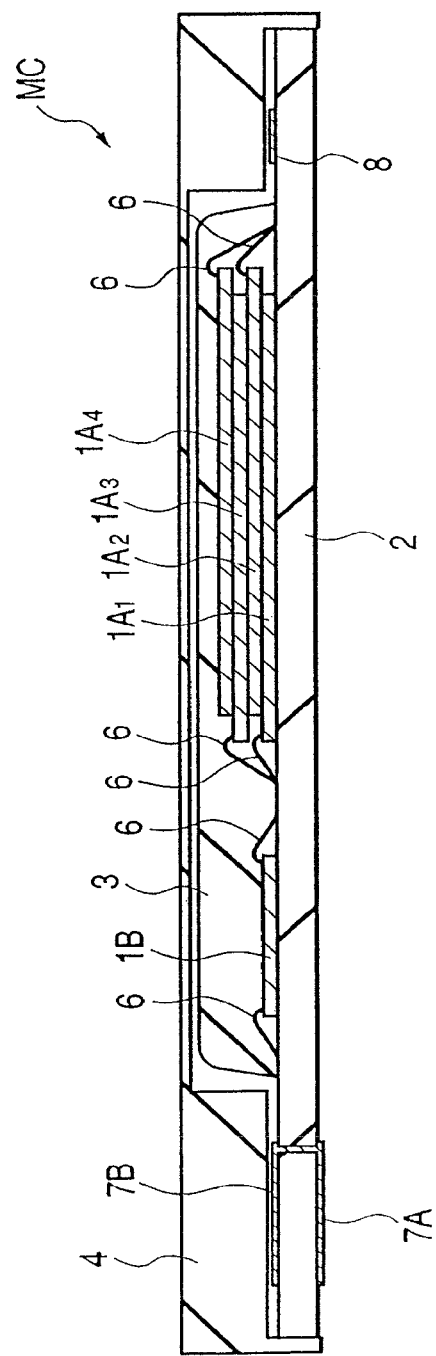
FIG. 13 is a cross-sectional view illustrating the semiconductor device according to a still further embodiment of the present invention.
Figure 14:
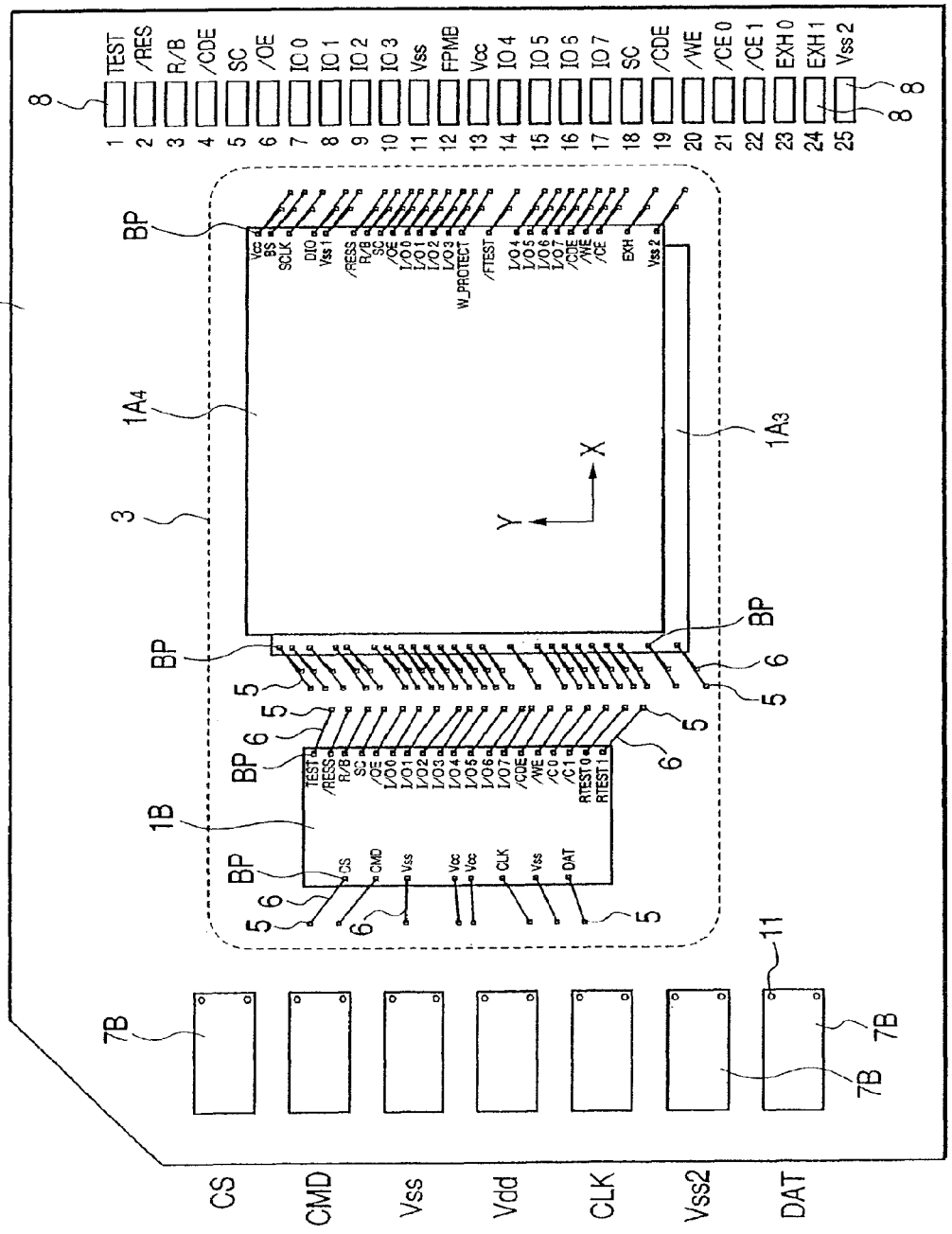
FIG. 14 is a plan view illustrating the base substrate of the semiconductor device of FIG. 13.

FIG. 13 is a cross-sectional view illustrating the semiconductor device of this Embodiment, while FIG. 14 is a plan view illustrating the base substrate of this semiconductor device.

The semiconductor device of this Embodiment is a memory card MC obtained by mounting over a base substrate 2 four memory chips $1A_1$ to $1A_4$, each having a flash memory formed thereon, and a control chip 1B; sealing these chips $1A_1$ to $IA_4$ and 1B with a resin 3; and covering the upper surface of the base substrate 2 with a resin cap 4.

The four memory chips $1A_1$ to $1A_4$ have the same external size and have a flash memory of the same memory capacity formed thereon. These memory chips $1A_1$ to $1A_4$ each have a single-side pad system wherein bonding pads BP are formed at the periphery of the element surface, and they are arranged in a line along one of the sides of each of the memory chips.

In this Embodiment, these four memory chips $1A_1$ to $1A_4$ are mounted over the base substrate 2, while being stacked in four layers. In this case, the second memory chip $1A_2$ and fourth memory chip $1A_4$ are stacked relative to the first memory chip $1A_1$ and the third memory chip $1A_3$, respectively, while sliding the former ones in a direction (X direction) parallel to the one side along which bonding pads BP are arranged and in a direction (Y direction) perpendicular thereto. The memory chips $1A_1$ to $1A_4$, are stacked one on another with their faces turned in the same direction. The memory chips $1A_1$ and $1A_3$, as well as the memory chips $1A_2$ and $1A_4$, are stacked one after another so that the upper one lies right above the lower one when viewed from above. The second memory chip $1A_2$ and the top memory chip $1A_4$ are oriented relative to the bottom memory chip $1A_1$ and the third memory chip $1A_3$, respectively, so that the position of the bonding pads BP are reversed, that is, right side left.

In the above-described chip stacking system according to this Embodiment, no horizontal sliding occurs between the wires 6 of the bottom memory chip $1A_1$ and the third memory chip $1A_3$, and also between the two wires 6 of the second memory chip $1A_2$ and the outermost memory chip $1A_4$, but existence of another memory chip between the memory chips $1A_1$ and $1A_3$, or $1A_2$ and $1A_4$ makes it possible to conduct wire bonding without giving any consideration to the wire loop.

Accordingly, the upper and lower wires 6 to be bonded on the same side become free from a short-circuit problem, so that the state of connection of the wire 6 can be judged easily using a camera or the like in a visual inspection step conducted after the completion of the wire bonding step.

Figure 15:
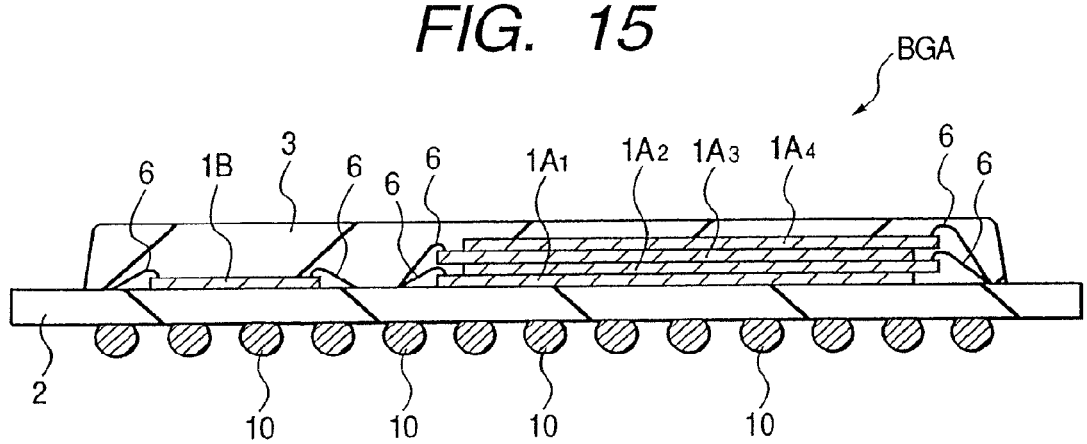
FIG. 15 is a cross-sectional view illustrating the semiconductor device according to a still further embodiment of the present invention.
Figure 16:
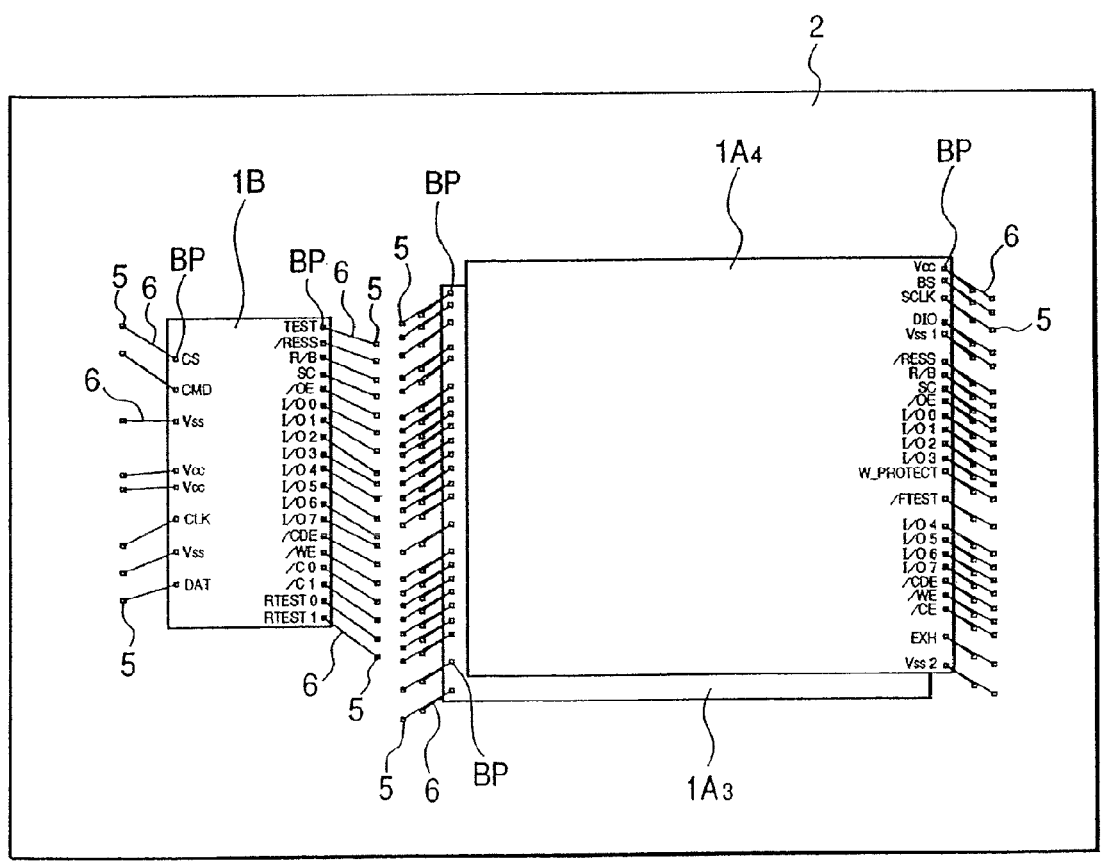
FIG. 16 is a plan view illustrating the base substrate of the semiconductor device of FIG. 15.

As illustrated in FIGS. 15 and 16, the chip stacking system according to this Embodiment can be applied, similar to the chip stacking system of Embodiment 1, to a resin-sealed type package, such as one using a BGA. It is needless to say that, as in Embodiment 1, a control chip 1B smaller in external size than the outermost memory chip $1A_4$ can be stacked over the upper surface thereof.

Figure 17:
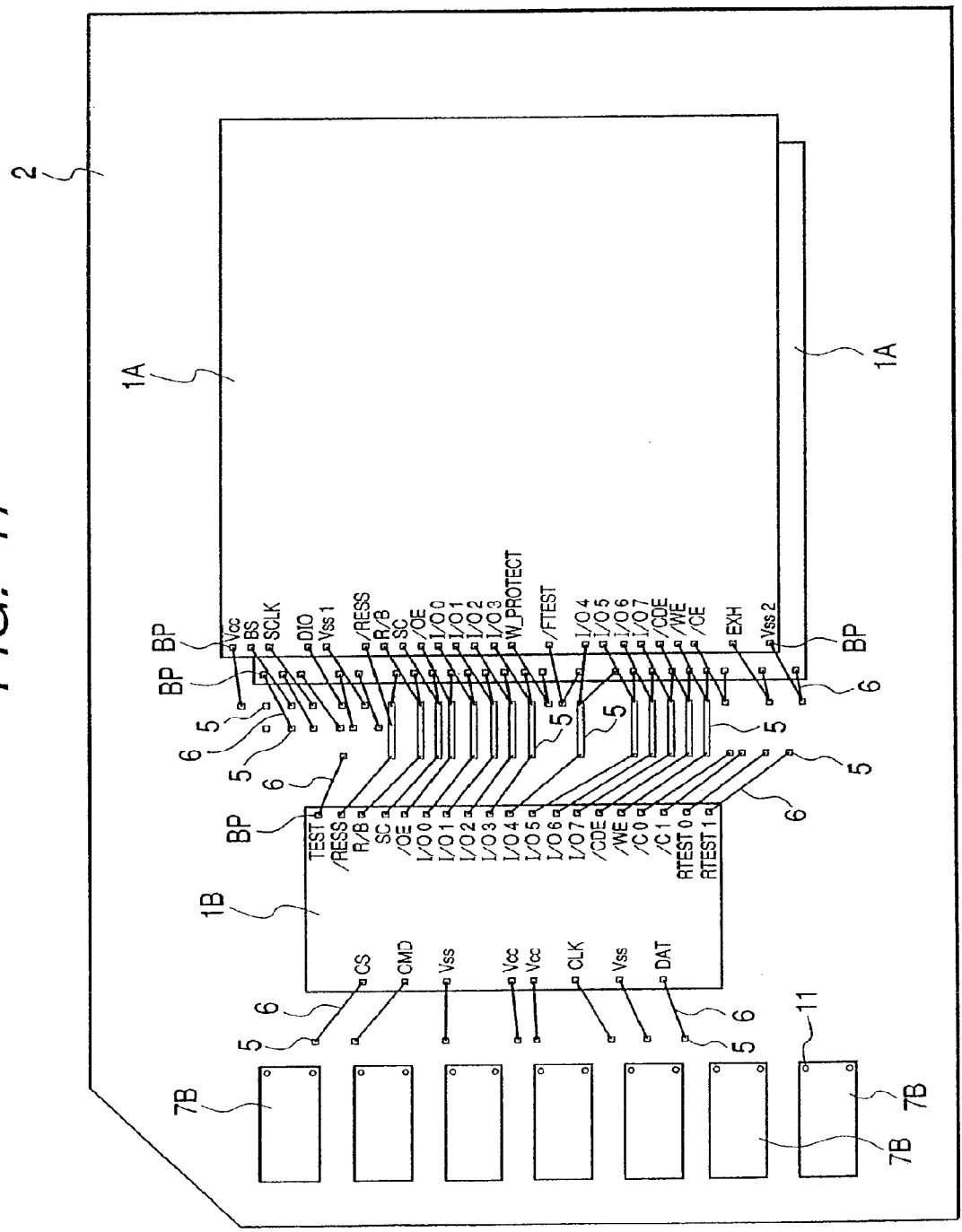
FIG. 17 is a plan view illustrating the base substrate of the semiconductor device according to a still further embodiment of the present invention.

As illustrated in FIG. 17, bonding pads BP (signal pins) common to each of the two memory chips 1A and control chip 1B may be connected with the same electrode 5 on the base substrate 2. FIG. 17 illustrates an example of application of such a structure to a memory card MC. It is needless to say that such a structure can be applied to a BGA type package as well.

The invention made by the present inventors so far has been described specifically based on some Embodiments. It should however be borne in mind that the present invention is not limited to or by these Embodiments and can be modified within an extent not departing from the scope of the present invention.

In the above-described Embodiments, a description was made concerning the stacking of chips, each having a flash memory formed thereon. Those embodiments are not limited to such a construction, but can also be applied to stacking of a plurality of chips which are different in external size or in the kind of a memory formed thereon.

In the above-described Embodiments, a description was made concerning the stacking of two or four memory chips. Those embodiments are not limited thereto, but can also provide for the stacking of three chips, as well as at least five chips.

Advantages available from the typical inventive features disclosed by the present application will next be described.

The present invention makes it possible, in a semiconductor device obtained by stacking a plurality of semiconductor chips, and then sealing the chips with a resin, to reduce the occurrence of a short circuit between the wires connected with the bonding pad of the lower semiconductor chip and that of the upper semiconductor chip.

The present invention makes it possible, in a semiconductor device obtained by stacking a plurality of semiconductor chips, and then sealing the chips with a resin, to improve the reliability of the visual inspection conducted after the wire bonding step.

The present invention makes it possible to promote a size and thickness reduction of a semiconductor device obtained by stacking a plurality of semiconductor chips, and then sealing the chips with a resin.

The present invention facilitates the stacking of a plurality of semiconductor chips, thereby making it possible to realize a small-sized, thin and large-capacity memory package.

The present invention makes it possible, in a semiconductor device obtained by stacking a plurality of semiconductor chips, and then sealing the chips with a resin, to reduce the manufacturing cost of the semiconductor device, because the semiconductor chip and the substrate can be electrically connected by a wire bonding system.

The invention claimed is:

1. A device comprising:
   a substrate having a main surface, a rear surface opposite to the main surface, a first peripheral edge and a second peripheral edge opposite to and in parallel with the first peripheral edge, the substrate also having a third peripheral edge perpendicular to the first peripheral edge and a fourth peripheral edge opposite to and in parallel with the third peripheral edge;
   a plurality of first electrodes on the main surface, the plurality of first electrodes being disposed adjacent to the first peripheral edge including a first row and a second row of the plurality of first electrodes;
   a plurality of second electrodes on the main surface, the plurality of second electrodes including one of a first row of the plurality of second electrodes disposed adjacent to and in parallel with the second peripheral edge, a second row of the plurality of second electrodes disposed adjacent to and in parallel with the third peripheral edge, a third row of the plurality of second electrodes disposed adjacent to and in parallel with the fourth peripheral edge, and any combinations thereof;
   a first semiconductor chip having a first main surface and a plurality of bonding pads formed on the first main surface, the first semiconductor chip being mounted on the main surface of the substrate;
   a second semiconductor chip having a second main surface and a plurality of bonding pads formed on the second main surface, the second semiconductor chip being mounted on the first main surface of the first semiconductor chip;
   a third semiconductor chip having a third main surface and a plurality of bonding pads formed on the third main surface, the third semiconductor chip being mounted on the second main surface of the second semiconductor chip;
   first wires electrically connecting each one of the bonding pads of the first semiconductor chip with a corresponding one of the first row of plurality of first electrodes;
   second wires electrically connecting each one of the bonding pads of the second semiconductor chip with a corresponding one of the second row of plurality of first electrodes;
   third wires electrically connecting each one of the bonding pads of the third semiconductor chip with a corresponding one of the plurality of second electrodes, wherein the first semiconductor chip and the second semiconductor chip both includes a memory circuit, and
   wherein the third semiconductor chip includes a control circuit,
   wherein the first electrodes are positioned along only one side of the mounted first semiconductor chip adjacent to the first peripheral edge, in a plan view thereof,
   wherein the second electrodes are positioned along other sides of the mounted first semiconductor chip adjacent to the second peripheral edge, the third peripheral edge, the fourth peripheral edge, in a plan view thereof and
   wherein the plurality of bonding pads on the third semiconductor chip are disposed in a first row on the third main surface along the one side of the mounted first semiconductor chip in parallel with the first peripheral edge and in a second row on the third main surface along a second side of the mounted first semiconductor chip in parallel with the second peripheral edge, in a plan view thereof.

2. The device as claimed in claim 1 further including a plurality of external connection terminals disposed on the rear surface of the substrate, each one of the plurality of external connection terminals being electrically coupled to a corresponding one of the plurality of the first and the second electrodes on the main surface of the substrate.

3. The device as claimed in claim 1, wherein the bonding pads on the first semiconductor chip are disposed in a row on the first main surface along the one side of the mounted first semiconductor chip in parallel with the first peripheral edge, in a plan view thereof.

* * * * *